US012324143B2

(12) United States Patent
Tang et al.

(10) Patent No.: US 12,324,143 B2
(45) Date of Patent: Jun. 3, 2025

(54) METHODS OF UTILIZING ETCH-STOP MATERIAL DURING FABRICATION OF CAPACITORS, INTEGRATED ASSEMBLIES COMPRISING CAPACITORS

(71) Applicant: Micron Technology, Inc., Boise, ID (US)

(72) Inventors: Sanh D. Tang, Meridian, ID (US); Ke-Hung Chen, Boise, ID (US); Christopher W. Petz, Boise, ID (US); Pankaj Sharma, Boise, ID (US); Yong Mo Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 438 days.

(21) Appl. No.: 16/851,588

(22) Filed: Apr. 17, 2020

(65) Prior Publication Data
US 2021/0327881 A1    Oct. 21, 2021

(51) Int. Cl.
H10B 12/00    (2023.01)
H10D 1/68    (2025.01)
H10D 84/80    (2025.01)

(52) U.S. Cl.
CPC .............. H10B 12/30 (2023.02); H10D 1/692 (2025.01); H10D 84/811 (2025.01)

(58) Field of Classification Search
CPC ........... H01L 27/10805; H01L 27/0727; H01L 28/60; H01L 27/10855; H01L 27/10852;
(Continued)

(56) References Cited

U.S. PATENT DOCUMENTS 5,444,018 A * 8/1995 Yost .................. H01L 21/28512
257/E21.59
5,654,235 A * 8/1997 Matsumoto ....... H01L 23/53223
438/658
(Continued)

FOREIGN PATENT DOCUMENTS

KR    10-2008-0005766    1/2008
KR    10-2015-0067742    5/2015
WO    WO2013/052067 A1    4/2013

OTHER PUBLICATIONS

WO PCT/US2021/023153 SrchRpt, Jul. 12, 2021, Micron Technology, Inc.
(Continued)

*Primary Examiner* — David Vu
(74) *Attorney, Agent, or Firm* — Wells St. John P.S.

(57) ABSTRACT

Some embodiments include an integrated assembly having capacitor-contact-regions. Metal-containing interconnects are coupled with the capacitor-contact-regions. A first insulative material is between the metal-containing interconnects. A second insulative material is over the first insulative material. A third insulative material is over the second insulative material. First capacitor electrodes extend through the second and third insulative materials and are coupled with the metal-containing interconnects. Fourth insulative material is adjacent the first capacitor electrodes. Capacitor plate electrodes are adjacent the fourth insulative material and are spaced from the first capacitor electrodes by the fourth insulative material. Some embodiments include methods of forming integrated assemblies.

9 Claims, 11 Drawing Sheets

(58) Field of Classification Search
CPC . H01L 27/11507; H01L 28/90; H01L 27/0688
See application file for complete search history.

(56) References Cited

U.S. PATENT DOCUMENTS

| | | | |
|---|---|---|---|
| 6,593,234 B2* | 7/2003 | Hu | H01L 21/76879 |
| | | | 438/651 |
| 6,924,193 B2* | 8/2005 | Lin | H01L 28/60 |
| | | | 257/303 |
| 8,072,074 B2* | 12/2011 | Hachisuka | H01L 21/76838 |
| | | | 257/758 |
| 9,553,586 B2 | 1/2017 | Genoe | |
| 9,565,766 B2 | 2/2017 | Lindert | |
| 10,020,360 B1* | 7/2018 | Ramaswamy | H01L 21/764 |
| 10,103,053 B1* | 10/2018 | Sukekawa | H01L 21/76256 |
| 2002/0163026 A1* | 11/2002 | Park | H01L 28/91 |
| | | | 257/E21.01 |
| 2005/0280061 A1* | 12/2005 | Lee | H01L 24/29 |
| | | | 257/296 |
| 2006/0273426 A1* | 12/2006 | Iijima | H10B 12/033 |
| | | | 257/532 |
| 2007/0034928 A1 | 2/2007 | Cook | |
| 2007/0224753 A1* | 9/2007 | Tang | H01L 29/7827 |
| | | | 257/E21.643 |
| 2010/0090264 A1 | 4/2010 | Moll | |
| 2011/0215391 A1* | 9/2011 | Takaishi | H01L 29/78 |
| | | | 257/334 |
| 2013/0065394 A1 | 3/2013 | Suen et al. | |
| 2014/0027883 A1 | 1/2014 | Hu | |
| 2014/0332800 A1* | 11/2014 | Hanaoka | H01L 29/41733 |
| | | | 257/43 |
| 2016/0111325 A1 | 4/2016 | JangJian et al. | |
| 2018/0195049 A1 | 7/2018 | Ramaswamy | |
| 2018/0197864 A1 | 7/2018 | Sills | |
| 2018/0197869 A1 | 7/2018 | Chavan et al. | |
| 2019/0189357 A1 | 6/2019 | Chavan et al. | |
| 2020/0043931 A1* | 2/2020 | Sato | H01L 27/1225 |
| 2020/0051849 A1 | 2/2020 | Ramaswamy | |

OTHER PUBLICATIONS

WO PCT/US2021/023153 WtnOpn, Jul. 12, 2021, Micron Technology, Inc.
WO PCT/US2021/023153 IPRP, Oct. 13, 2022, Micron Technology, Inc.
Wikipedia, "Dual-Damascene Process", available online at https://de.wikipedia.org/wiki/Dual-Damascene-Prozess#expand, Oct. 23, 2018, 6 pages.

* cited by examiner

METHODS OF UTILIZING ETCH-STOP MATERIAL DURING FABRICATION OF CAPACITORS, INTEGRATED ASSEMBLIES COMPRISING CAPACITORS

TECHNICAL FIELD

Integrated assemblies and integrated memory (e.g., DRAM, FeRAM, etc.). Methods of forming integrated assemblies.

BACKGROUND

Memory may utilize memory cells which individually comprise an access transistor in combination with a capacitor. The capacitor may be a ferroelectric capacitor if the memory is ferroelectric random-access memory (FeRAM), or may be a non-ferroelectric capacitor if the memory is traditional dynamic random-access memory (DRAM).

It would be desirable to develop improved memory architecture, and improved methods of forming memory architecture. It would also be desirable for such methods to be applicable for fabrication of FeRAM and DRAM.

DETAILED DESCRIPTION OF THE ILLUSTRATED EMBODIMENTS

Some embodiments include methods of utilizing etch-stop material (e.g., silicon nitride, metal oxide, etc.) during fabrication of capacitors. Some embodiments include memory (e.g., DRAM, FeRAM, etc.) which includes capacitors. Example embodiments are described with reference to FIGS. 1-9.

Figure 1:
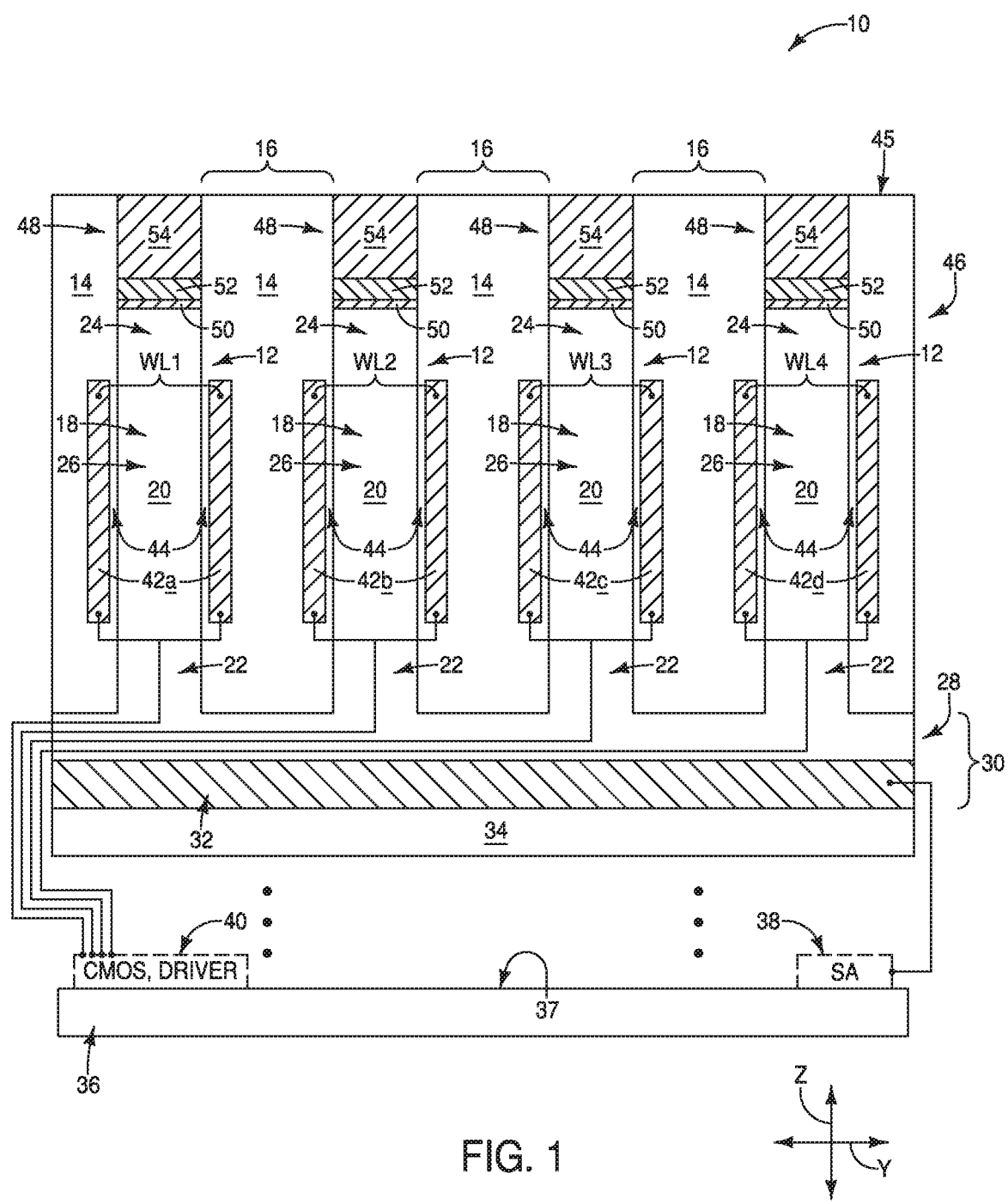
FIGS. 1-4 are diagrammatic cross-sectional side views of an example assembly at example sequential process stages of an example method.

Referring to FIG. 1, an integrated assembly 10 includes access transistors 12 extending through insulative material 14.

The insulative material 14 may comprise any suitable composition(s). In some embodiments, the insulative material 14 may comprise, consist essentially of, or consist of one or more of silicon dioxide, aluminum oxide, hafnium oxide, zirconium oxide, etc. The insulative material 14 may comprise a single homogeneous composition, or may comprise two or more discrete compositions which join to one another at abrupt interfaces and/or along gradients.

The access transistors 12 are laterally spaced from one another, and specifically are spaced from one another by intervening regions 16.

Each of the access transistors 12 includes a vertically-extending active region 18 comprising semiconductor material 20.

The semiconductor material 20 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 20 may comprise, consist essentially of, or consist of silicon. The silicon may be in any suitable crystalline form, such as, for example, polycrystalline, amorphous, monocrystalline, etc.

The active regions 18 may be referred to as vertically-extending pillars of the semiconductor material 20.

Each of the active regions 18 includes a lower source/drain region 22, an upper source/drain region 24, and a channel region 26 between the lower and upper source/drain regions. The lower and upper source/drain regions may be conductively-doped with suitable dopant (e.g., phosphorus, boron, arsenic, etc.), and the channel region may be appropriately doped to achieve a desired threshold voltage.

The active regions 18 extend upwardly from a mass 28 of the semiconductor material 20. The mass 28 is part of a digit line 30. In the illustrated embodiment, the digit line also includes a metal-containing region 32. The metal-containing region may comprise any suitable electrically conductive composition(s); such as, for example, one or more of various metals (e.g., titanium, tungsten, cobalt, nickel, platinum, ruthenium, etc.) and/or metal-containing compositions (e.g., metal silicide, metal nitride, metal carbide, etc.).

The digit line 30 may be considered to be a first conductive structure which extends along a first direction. Such first direction is along an illustrated y-axis (i.e., is along the plane of the cross-section of FIG. 1).

The digit line 30 supported by an insulative material 34. The insulative material 34 may comprise any suitable composition(s); and in some embodiments may comprise, consist essentially of, or consist of silicon dioxide.

The insulative material 34 is shown to be supported by an underlying base 36. The base 36 may comprise semiconductor material; and may, for example, comprise, consist essentially of, or consist of monocrystalline silicon. The base 36 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 36 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 36 and the insulative material 34 to indicate that other materials, structures, etc., may be provided between the base 36 and the insulative material 34. For instance, in the illustrated embodiment SENSE AMPLIFIER circuitry 38 (identified as SA) and WORDLINE DRIVER circuitry 40 (identified as DRIVER) are shown provided over the base 36, and beneath the insulative material 34. The circuitries 38 and 40 may comprise logic circuitry (e.g., CMOS, as is specifically illustrated relative to the driver circuitry 40). In the illustrated embodiment, the digit line 30 is selectively coupled with the SENSE AMPLIFIER circuitry 38. The SENSE AMPLIFIER circuitry 38 may be considered to be representative of sensing circuitry which may be coupled with the digit line.

In some embodiments, the base 36 may be considered to have an upper surface 37 which defines a horizontal direction, and the vertically-extending pillars 18 may extend along a direction which is substantially orthogonal to such horizontal direction (with the term "substantially orthogonal" meaning orthogonal to within reasonable tolerances of fabrication and measurement). In some embodiments, the horizontal surface 37 may extend along the illustrated y-axis direction, and the vertically-extending pillars 18 may extend upwardly along an illustrated z-axis direction. The vertically-extending pillars 18 may extend along a direction which is within about 20° of normal to (i.e., orthogonal to) the y-axis direction, within about 10° of normal to the y-axis direction, within about 5° of normal to the y-axis direction, etc.

Conductive structures 42a-d are along the channel regions 26 of the vertically-extending pillars 18. The conductive structures 42a-d extend in and out of the page relative to the cross-section of FIG. 1, and accordingly extend along a second direction which crosses the first direction of the digit line 30 (i.e., which crosses the illustrated y-axis direction). In some embodiments, the conductive structures 42a-d may be considered to extend along an x-axis direction, with such x-axis direction being described below with reference to FIG. 9.

Referring still to FIG. 1, the conductive structures 42a-d may correspond to wordlines WL1-WL4. In some embodiments, the wordlines WL1-WL4 may be considered to have segments (specifically, gate regions) operatively adjacent to (operatively proximate to) the channel regions 26 such that a sufficient voltage applied to an individual of the wordlines will induce an electric field which enables current flow through an associated one of the channel regions to electrically couple the source/drain regions on opposing sides of the channel region with one another. If the voltage to the individual wordline is below a threshold level, the current will not flow through the associated channel region, and the source/drain regions on opposing sides of the channel region will not be electrically coupled with one another. The selective control of the coupling/decoupling of the source/drain regions through the level of voltage applied to the wordline may be referred to as gated coupling of the source/drain regions. The wordlines WL1-WL4 are shown to be electrically coupled with the driver circuitry 40, and such driver circuitry may be configured to provide appropriate voltage to the wordlines to induce the above-described gated coupling of the source/drain regions 22 and 24 through the channel regions 26.

The wordlines WL1-WL4 are shown to be spaced from the channel regions 26 by intervening regions 44. Such intervening regions comprise insulative material. The insulative material may be referred to as gate dielectric material. Such gate dielectric material within the regions 44 may be the same as the insulative material 14, or may be different from the insulative material 14.

In some embodiments, a construction 46 may be considered to comprise the insulative material 14 and the access transistors 12, with such construction including the intervening regions 16 between the laterally-spaced access transistors 12. The intervening regions 16 comprise the insulative material 14, and may be referred to as insulative regions.

Conductive interconnects 48 are formed over the upper source/drain regions 24 of the access transistors 12. The conductive interconnects 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In the illustrated embodiment, the conductive interconnects 48 comprise three conductive materials 50, 52 and 54. The material 50 may be a metal silicide (e.g., titanium silicide, tungsten silicide, etc.), the material 52 may be a metal nitride (e.g., tungsten nitride, tungsten silicide, etc.), and the material 54 may comprise, consist essentially of, or consist of metal (e.g., titanium, tungsten, etc.). In some embodiments, the material 54 may be referred to as being a substantially pure metal, where the term "substantially pure" means pure to within reasonable tolerances of fabrication and measurement. If the interconnects 48 comprise conductively-doped semiconductor material, they may comprise a same composition as the source/drain regions 24.

In some embodiments, the interconnects 48 are ultimately electrically coupled with capacitors (as described below with reference to FIG. 7). In such embodiments, the upper source/drain regions 24 may be referred to as capacitor-contact-regions. Similarly, since the lower source/drain regions 22 are electrically coupled with the digit line 30, the lower source/drain regions may be referred to as digit-line-contact-regions.

In some embodiments, the interconnects 48 may be referred to as electrodes of the transistors 12, and may be considered to be transistor electrodes. The vertical access transistors 12 are examples of switching devices. Other suitable access devices may include, for example, diodes, planar transistors (i.e., transistors having channel regions that extend parallel to, or substantially parallel to, the upper surface 37 of the base 36), etc.; and the interconnects 48 may be considered to be electrodes of such switching devices.

The insulative material 14 is shown to be provided between the interconnects 48. The interconnects 48 are laterally spaced from one another, and specifically are spaced from another by the intervening regions 16 comprising the insulative material 14.

A planarized surface 45 extends across the interconnects 48 and the insulative material 14. The planarized surface 45 may be formed with any suitable processing, including, for example, chemical-mechanical polishing (CMP).

Figure 2:
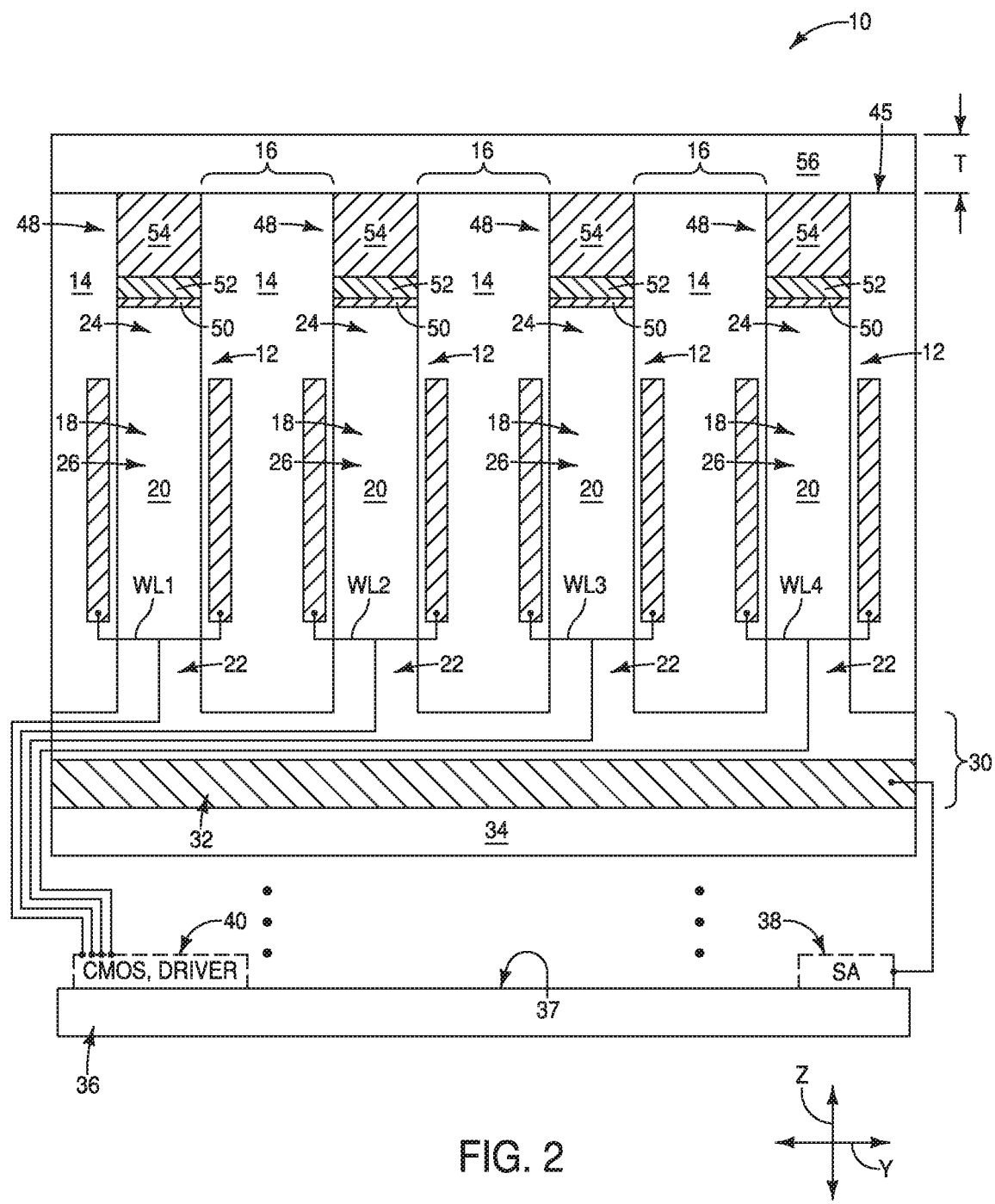

Referring to FIG. 2, a material 56 is formed over the upper surface 45; and specifically is formed to extend across the interconnects 48 and the insulative regions 16 between such interconnects. In the illustrated embodiment, the material 56 is directly against upper surfaces of the interconnects 48, and is directly against an upper surface of the insulative material 14.

The material 56 may comprise any suitable composition(s), and may be an insulative material. In some embodiments, the insulative material 56 may comprise, consist essentially of, or consist of silicon nitride. In some embodiments, the insulative material 56 may comprise, consist essentially of, or consist of one or more insulative metal oxides (e.g., one or more of hafnium oxide, zirconium oxide, aluminum oxide, etc.). In some embodiments, the insulative material 56 may be considered to comprise one or more of SiN, AlO, HfO and ZrO, where the chemical formulas indicate primary constituents rather than specific stoichiometries. In some embodiments, the insulative material 56 may comprise one or more high-k compositions, where the term high-k means a dielectric constant greater than that of silicon dioxide (i.e., greater than about 3.7).

The insulative material 56 may comprise a single homogeneous composition (as shown), or may comprise two or more different compositions. If the material 56 comprises two or more different compositions, the different compositions may join to one another along an abrupt interface or may join to one another along a gradient. The gradient may extend from one of the compositions to the other of the compositions, and may comprise a changing ratio of the compositions. For instance, in some embodiments the material 56 may comprise both hafnium oxide and zirconium oxide, and such materials may join to one another along a gradient. The gradient may proceed from a first region which is about 100% hafnium oxide to a second region which is about 100% zirconium oxide, and in transitioning from the first region to the second region may have an increasing ratio of the zirconium oxide to the hafnium oxide.

The insulative material 56 may have any suitable thickness T. In some embodiments such thickness may be within a range of from about 10 nanometers (nm) to about 1000 nm; within a range of from about 10 nm to about 200 nm, etc.

In some embodiments, the insulative materials 14 and 56 may be referred to as first and second insulative materials, respectively. The first insulative material 14 is laterally between the capacitor-contact-regions (upper source/drain regions) 24, and is laterally between the metal-containing interconnects 48. The second insulative material 56 is over the first insulative material 14, and is of a different composition relative to the first insulative material 14.

In some embodiments, the material 56 may be conductive (or semiconductive), and may be a sacrificial etch-stop material which is entirely removed at a subsequent process stage.

Figure 3:
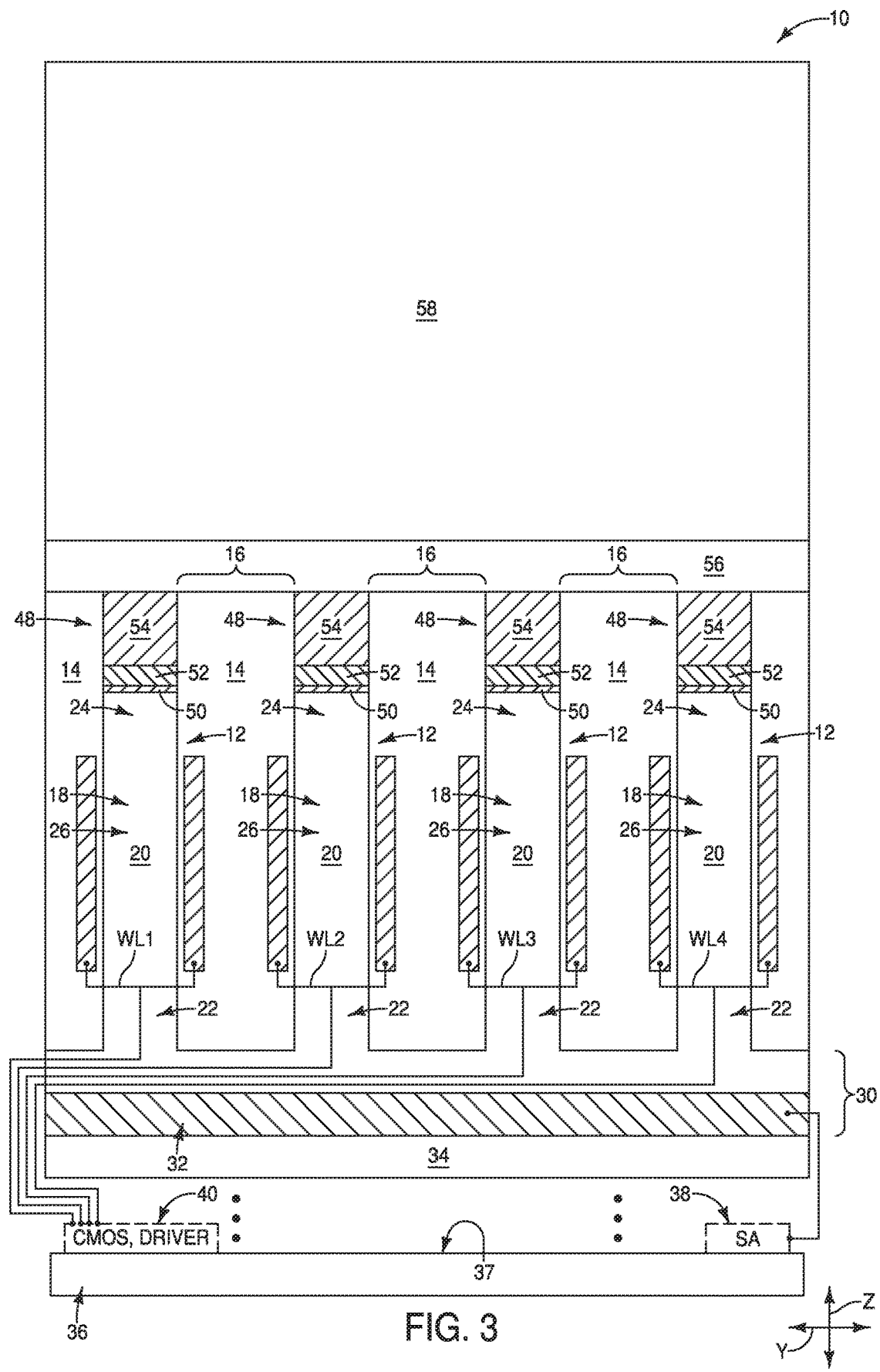

Referring to FIG. 3, another insulative material 58 is provided over the first insulative material 56. The insulative material 58 is of a different composition than the insulative material 56. The insulative material 58 may comprise any suitable composition(s); and in some embodiments may comprise, consist essentially of, or consist of silicon dioxide. The insulative material 58 may be referred to as a third insulative material to distinguish it from the first and second insulative materials 14 and 56. Alternatively, the insulative materials 56 and 58 may be referred to as first and second insulative materials, respectively (for instance, in embodiments in which the focus is on the insulative materials 56 and 58, rather than on the insulative materials 14, 56 and 58).

The insulative material 58 may comprise a same composition as the insulative material 14, or may comprise a different composition than the insulative material 14.

Figure 4:
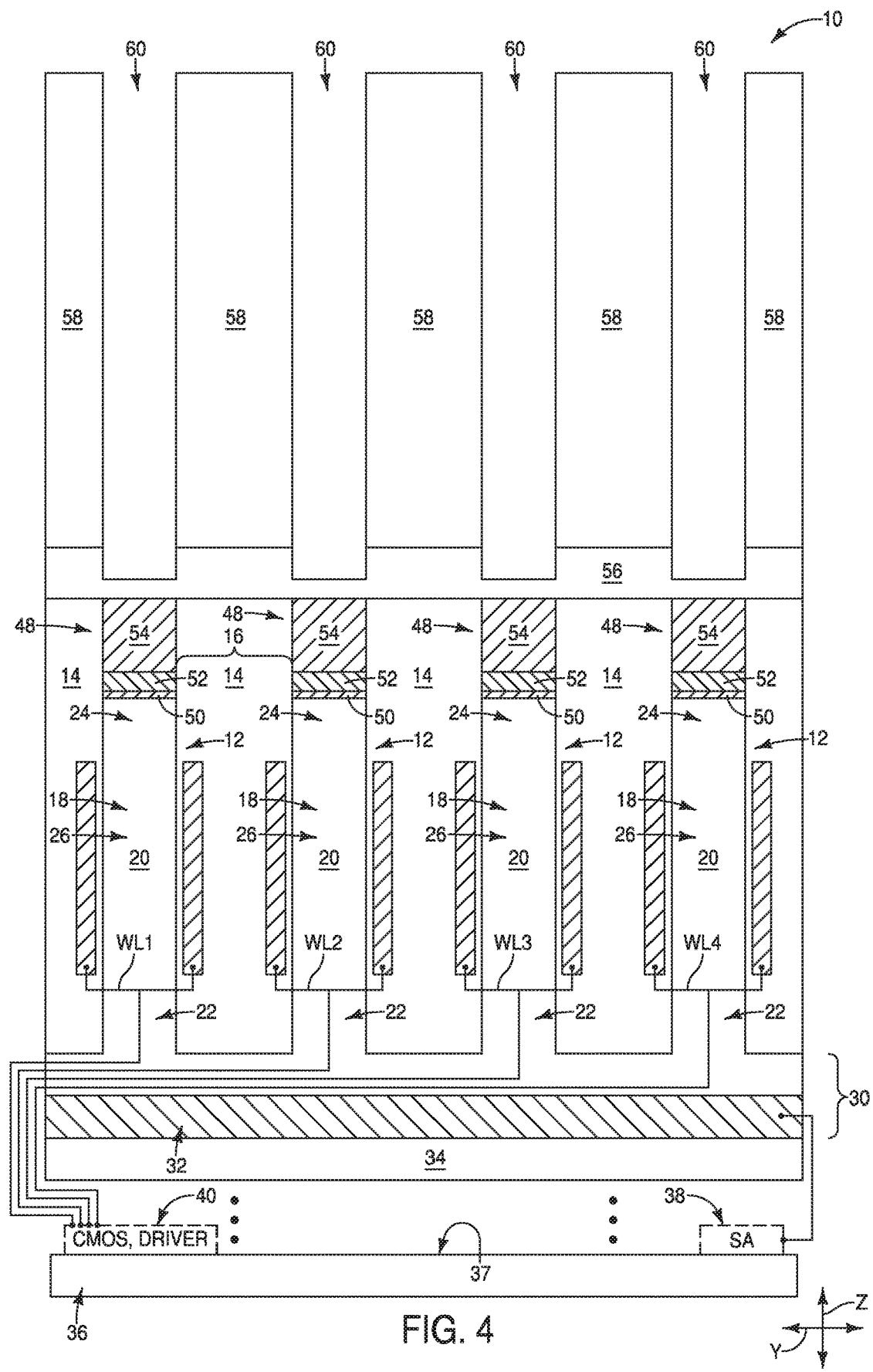
Figure 4A:
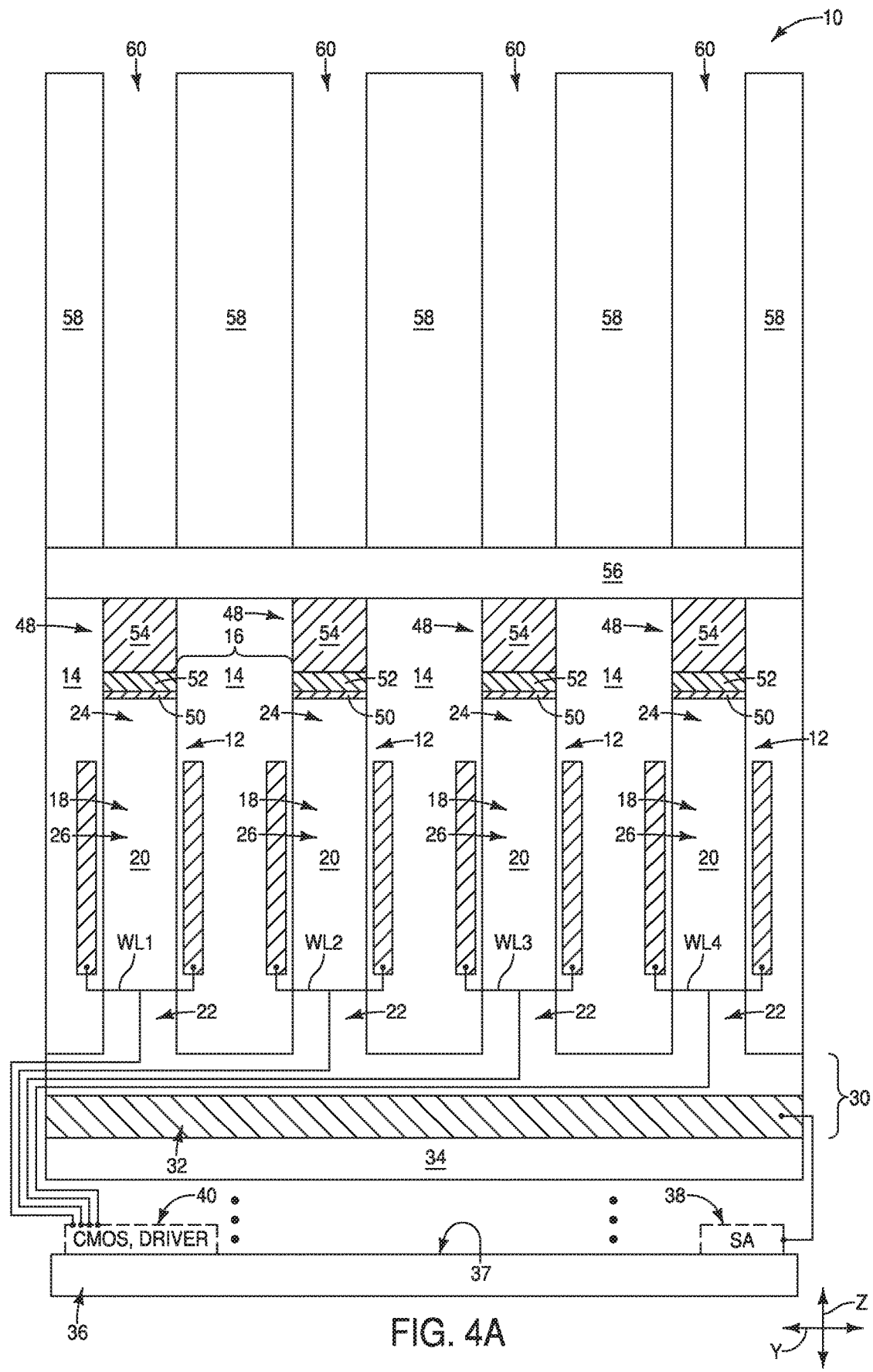
FIGS. 4A and 4B are diagrammatic cross-sectional side views of the example assembly of FIG. 4 at example process stages alternative to that of FIG. 4.

Referring to FIG. 4, openings 60 are formed to extend through the insulative material 58 with a first etch. In some embodiments the insulative material 56 may be referred to as an etch-stop material, in that it stops the first etch utilized to form the openings 60. The first etch may stop at an upper surface of the insulative material 56 (as shown relative to an alternative embodiment illustrated in FIG. 4A), or may penetrate into the material 56 (as shown in FIG. 4).

Figure 4B:
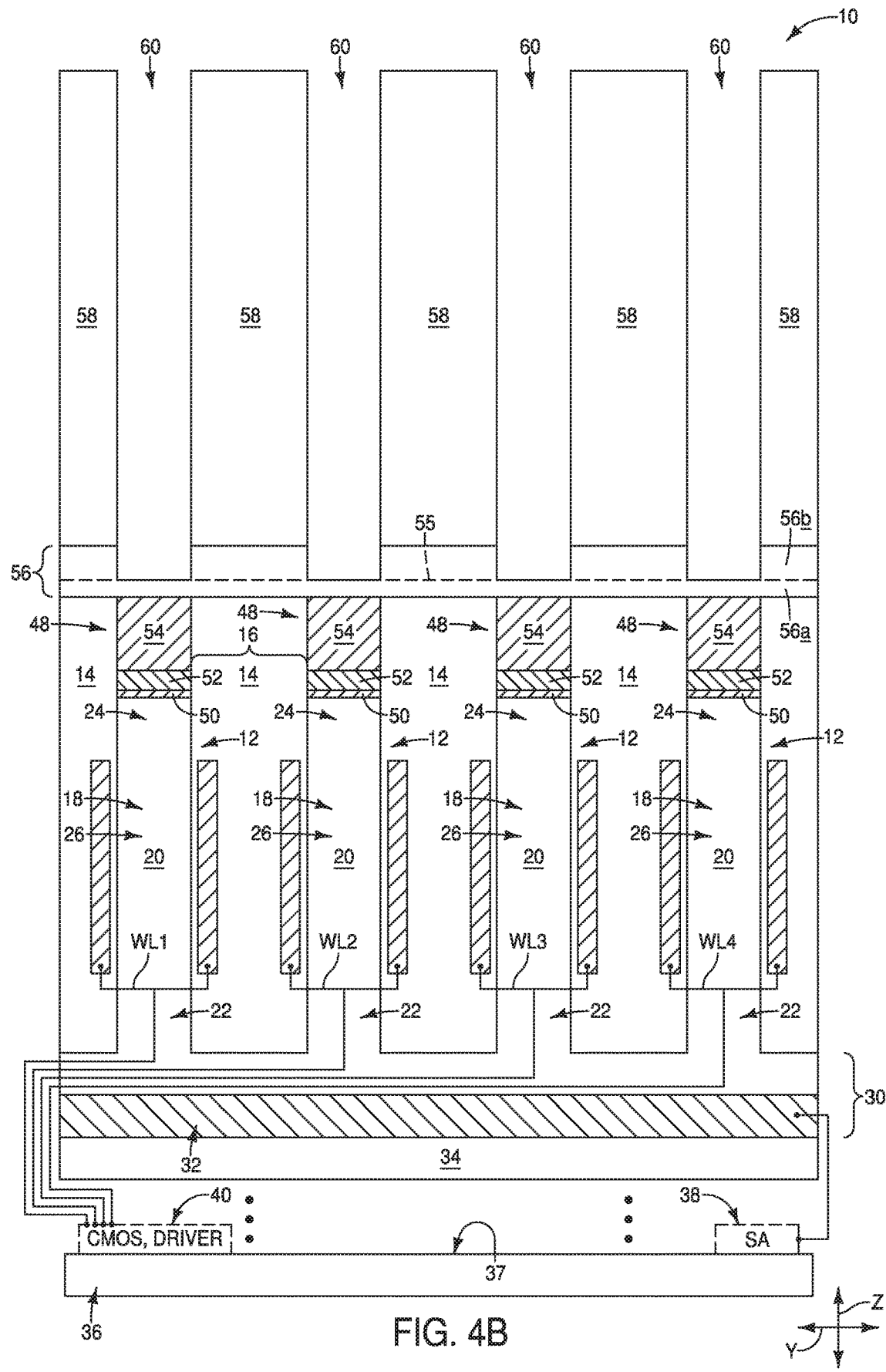

The etch-stop material 56 of FIG. 4 is shown as a monolayer. In some embodiments, the etch-stop material 56 may comprise two or more different compositions. For instance, the etch-stop material 56 may be a bilayer, as shown in FIG. 4B. Specifically, the etch-stop material 56 is shown to comprise a first composition 56a and a second composition 56b, with such compositions joining to one another along an interface 55. The interface may be an abrupt interface or may be a gradient. The first and second compositions 56a and 56b may be any suitable compositions. For instance, in some embodiments the first and second compositions may both comprise metal oxides (e.g., one of the compositions may be hafnium oxide and the other may be zirconium oxide).

Referring again to FIG. 4, in some embodiments the insulative materials 56 and 58 may comprise silicon nitride and silicon dioxide, respectively. In such embodiments the first etch utilized to form the opening 60 may comprise hydrofluoric acid.

Figure 5:
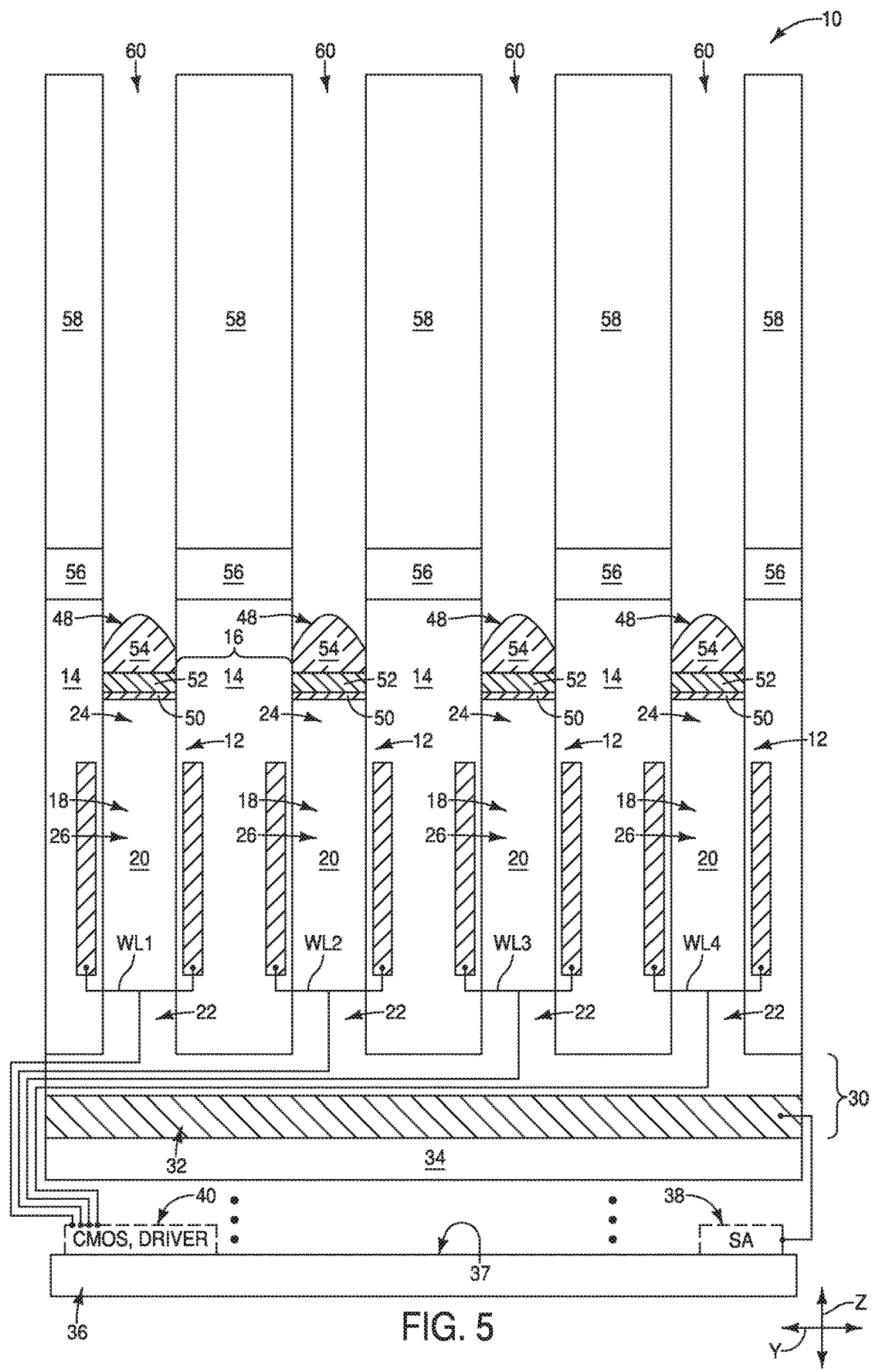
FIGS. 5-7 are diagrammatic cross-sectional side views of an example assembly at example sequential process stages of an example method. The process stage of FIG. 5 may follow that of FIG. 4.

Referring to FIG. 5, the openings 60 are extended through the material 56 with a second etch which is different from the first etch of FIG. 4. The second etch exposes the interconnects 48, and in the illustrated embodiment partially etches such interconnects to modify the shapes of the interconnects. In other embodiments the second etch may be sufficiently selective to the metal-containing material of the interconnects 48 so that such material is not appreciably removed. For purposes of interpreting this disclosure and the claims that follow, an etch is selective for a first material relative to a second material if the etch removes the first material at a faster rate than the second material; which can include, but which is not limited to, etches which are 100% selective for the first material relative to the second material.

The interconnects (transistor electrodes) 48 of FIG. 5 are shown to have convex shapes along the cross-section of FIG. 5. Such convex shapes may be considered to be substantially hemispherical shapes, substantially frustoconical shapes, and/or substantial round-nose-bullet-shapes in some embodiments. Notably, the widths of the interconnects 48 along the cross-section of FIG. 5 are no greater than the widths of the source/drain regions 24.

The three-dimensional convex shapes of the interconnects 48 may increase contact area for reliable contact to other conductive materials (e.g., capacitor electrode materials).

In embodiments in which the second material 56 comprises silicon nitride, the second etch of FIG. 5 may utilize phosphoric acid.

The openings 60 of FIG. 5 may be referred to herein as container openings.

Figure 6:
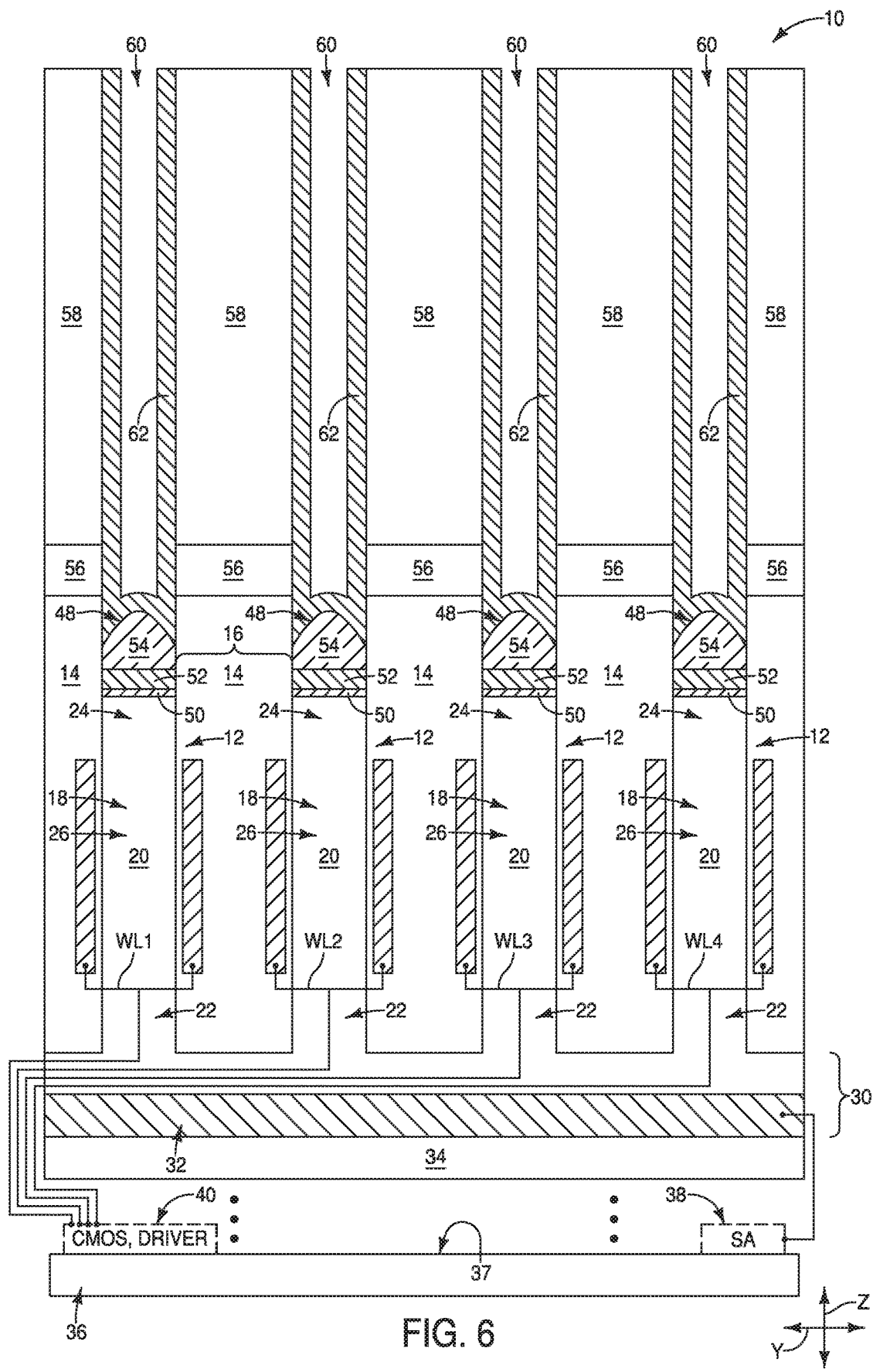

Referring to FIG. 6, first electrode material 62 is formed within the openings 60 to line the openings. The first electrode material 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first electrode material 62 may comprise tungsten over titanium nitride.

The electrode material 62 is directly against (i.e., directly contacts) the interconnects 48 in the shown embodiment. Specifically, there are no contact plugs, landing pads, or other conductive structures between the upper surfaces of the interconnects 48 and the electrode material 62.

Figure 7:
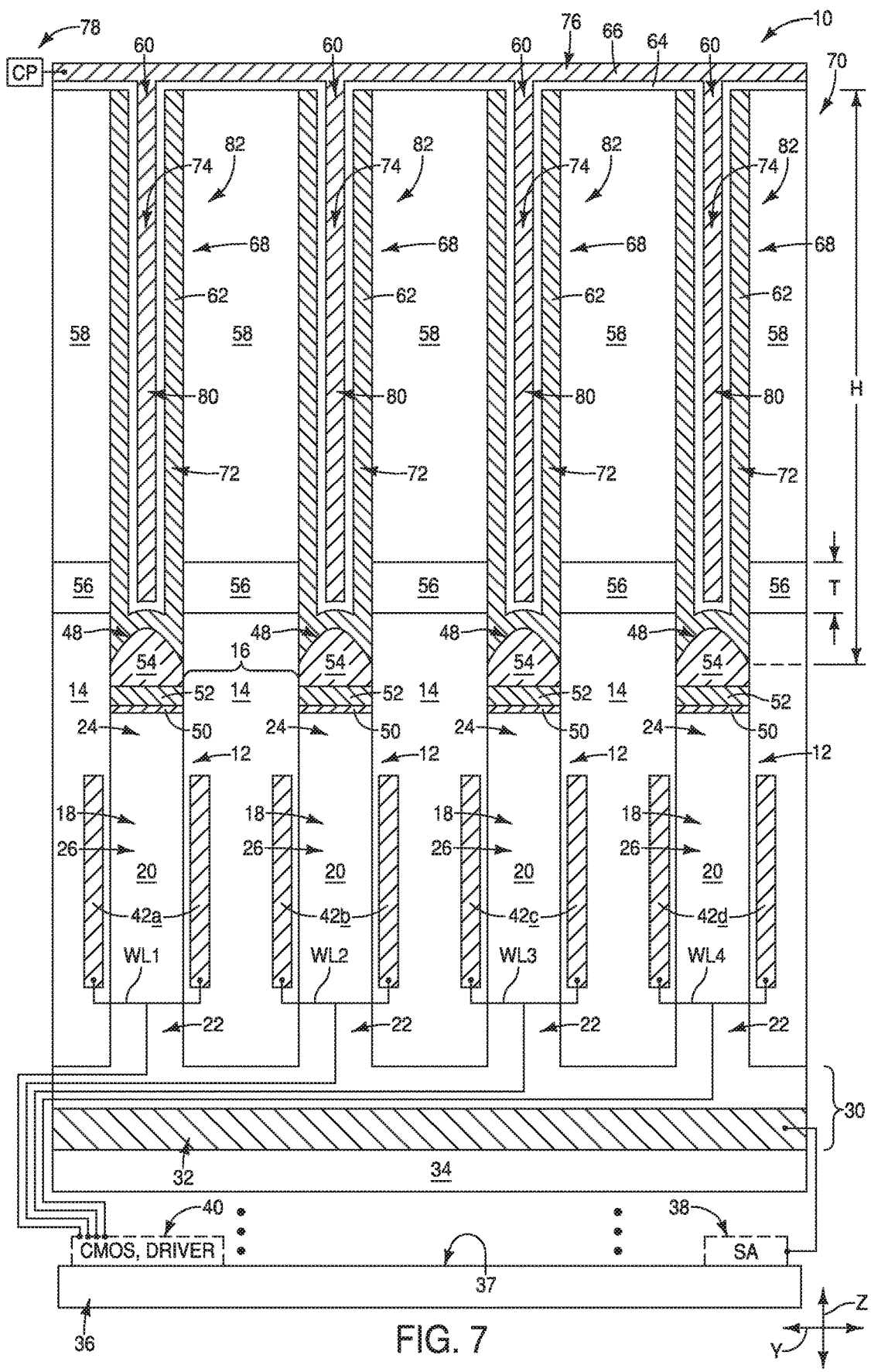

Referring to FIG. 7, insulative material (cell dielectric material) 64 is formed within the lined openings 60 and over the first electrode material 62.

The insulative material 64 may comprise any suitable composition(s). In some embodiments, the insulative material 64 may comprise only non-ferroelectric material (e.g., may be a non-ferroelectric insulative material). The non-ferroelectric insulative material may, for example, comprise, consist essentially of, or consist of one or more of silicon dioxide, aluminum oxide, hafnium oxide, zirconium oxide, etc. In some embodiments, the insulative material 64 may comprise ferroelectric material (e.g., may be a ferroelectric insulative material). The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

In some embodiments, the insulative material 64 may be referred to as a third insulative material to distinguish it from the first and second insulative material 56 and 58. In some embodiments, the insulative material 64 may be referred to as a fourth insulative material to distinguish it from the first, second and third insulative materials 14, 56 and 58.

Second electrode material 66 is formed over the insulative material 64, and also within the lined openings 60. The second electrode material 66 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments the second electrode material 66 may comprise the same composition(s) as the first electrode material 62, and in other embodiments the second electrode material 66 may comprise different composition(s) than the first electrode material 62.

The materials 62, 64 and 66 together form capacitors 68. Each of the capacitors is associated with one of the access transistors 12, and may form a memory cell of a memory array 70. The memory array may be a DRAM array if the insulative material 64 is non-ferroelectric, and may be a FeRAM array if the insulative material 64 is ferroelectric.

In the illustrated embodiment, the first electrode material 62 forms bottom electrodes 72 of the capacitors 68. Each of the bottom electrodes has an upwardly-opening container shape. Openings 74 extend into the upwardly-opening container shapes of the bottom electrodes 72. The electrode material 66 forms a capacitor plate electrode 76, and such capacitor plate electrode extends into the openings 74. In some embodiments, the electrodes 72 may be considered to be formed within the container openings 60 (FIG. 5), and at least portions of the cell dielectric material 64 and the plate electrode 76 may be considered to be formed within such container openings. In some embodiments, the electrode material 66 may be considered to form top electrodes of the capacitors 68.

The capacitor plate electrode 76 is shown to be electrically coupled with a reference source 78. The reference source is shown to be at a COMMON PLATE voltage (CP). The common plate voltage may be any suitable voltage, including, for example, a voltage within a range of from greater than or equal to ground (GND) to less than or equal to VCC/2 (i.e., the voltage CP may be represented by the equation GND≤CP≤VCC/2).

The bottom electrodes 72 may be referred to as first electrodes (i.e., first capacitor electrodes), and the capacitor plate electrode 76 may be considered to be configured as second electrodes (i.e., second capacitor electrodes) 80. Each of the capacitors 68 comprises one of the first electrodes and one of the second electrodes, and comprises the insulative material 64 between the first and second electrodes.

The illustrated first electrodes 72 extend through the insulative materials 14, 56 and 58, and are electrically coupled with the metal-containing interconnects 48. In the shown embodiment, the first electrodes 72 directly contact the metal-containing material 54 of the interconnects 48.

Each of the first electrodes 72 has a vertical height H. Such vertical height may be within a range of from about 500 nm to about 5 microns (μm). In some embodiments, the thickness T of the etch-stop material 56 may be within a range of from about 0.1% of the vertical height H to about 20% of the vertical height H.

The memory array 70 may be considered to comprise memory cells 82, with each memory cell 82 comprising one of the capacitors 68 and one of the access transistors 12. The memory cells 82 may be considered to be arranged in the array 70; with such array having rows along a first direction (the x-axis direction of FIG. 9), and having columns along a second direction (the y-axis direction of FIGS. 1-9). The first direction intersects the second direction (as shown in FIG. 9). The conductive structures 42a-d may be considered to be wordlines which extend along the rows of the memory array 70, and the conductive structure 30 may be considered to be a digit line which extends along a column of the memory array 70.

In the illustrated embodiment, the sensing circuitry 38 and the driver circuitry 40 are under the memory cells 82. In other embodiments, at least some of the sensing circuitry 38 and/or at least some of the driver circuitry 40 may be in other locations (e.g., laterally offset relative to the memory cells 82, above the memory cells 82, etc.).

Figure 8:
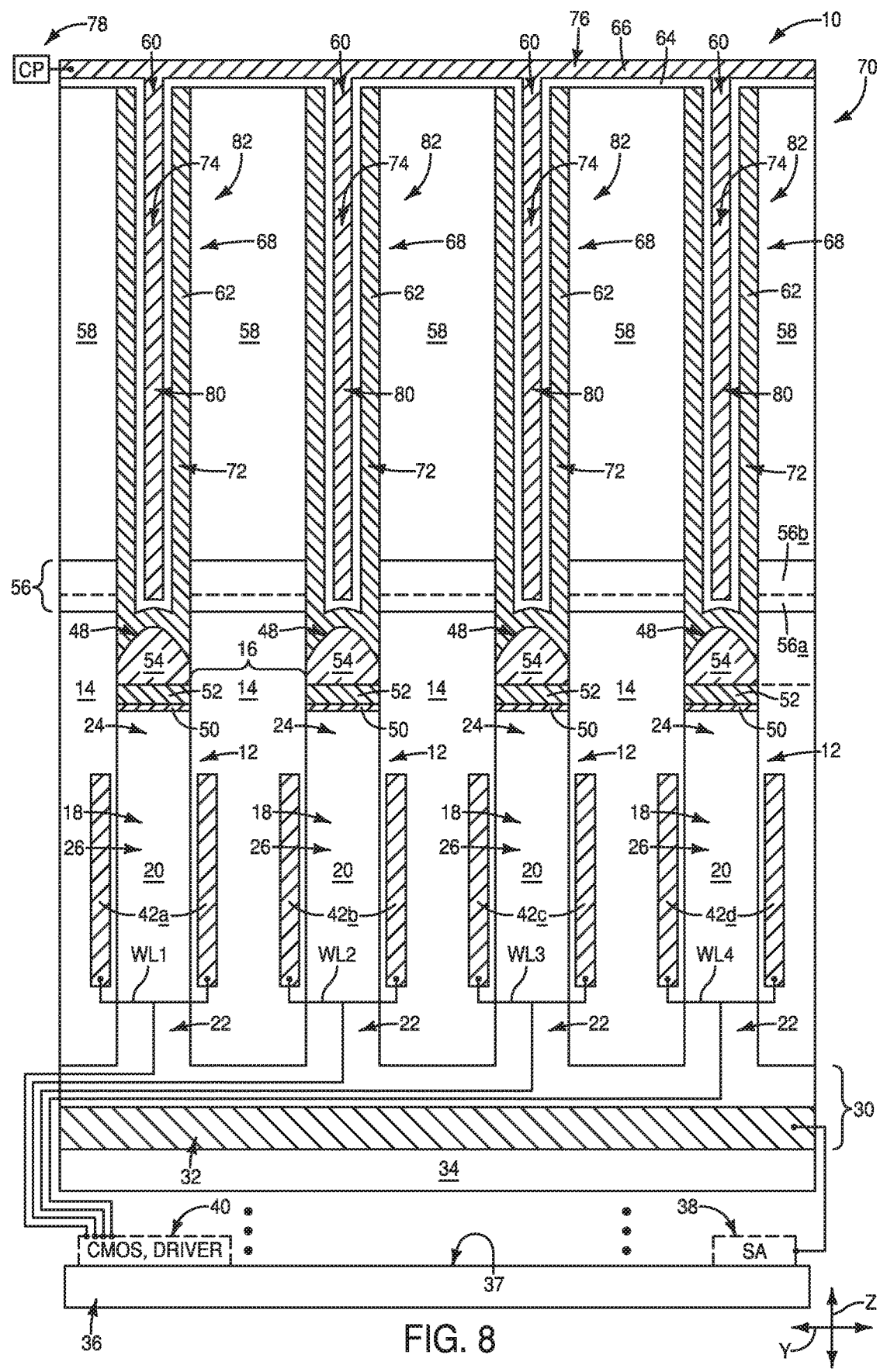
FIG. 8 is a diagrammatic cross-sectional side view of the example assembly of FIG. 7 at an example process stage alternative to that of FIG. 7.
Figure 9:
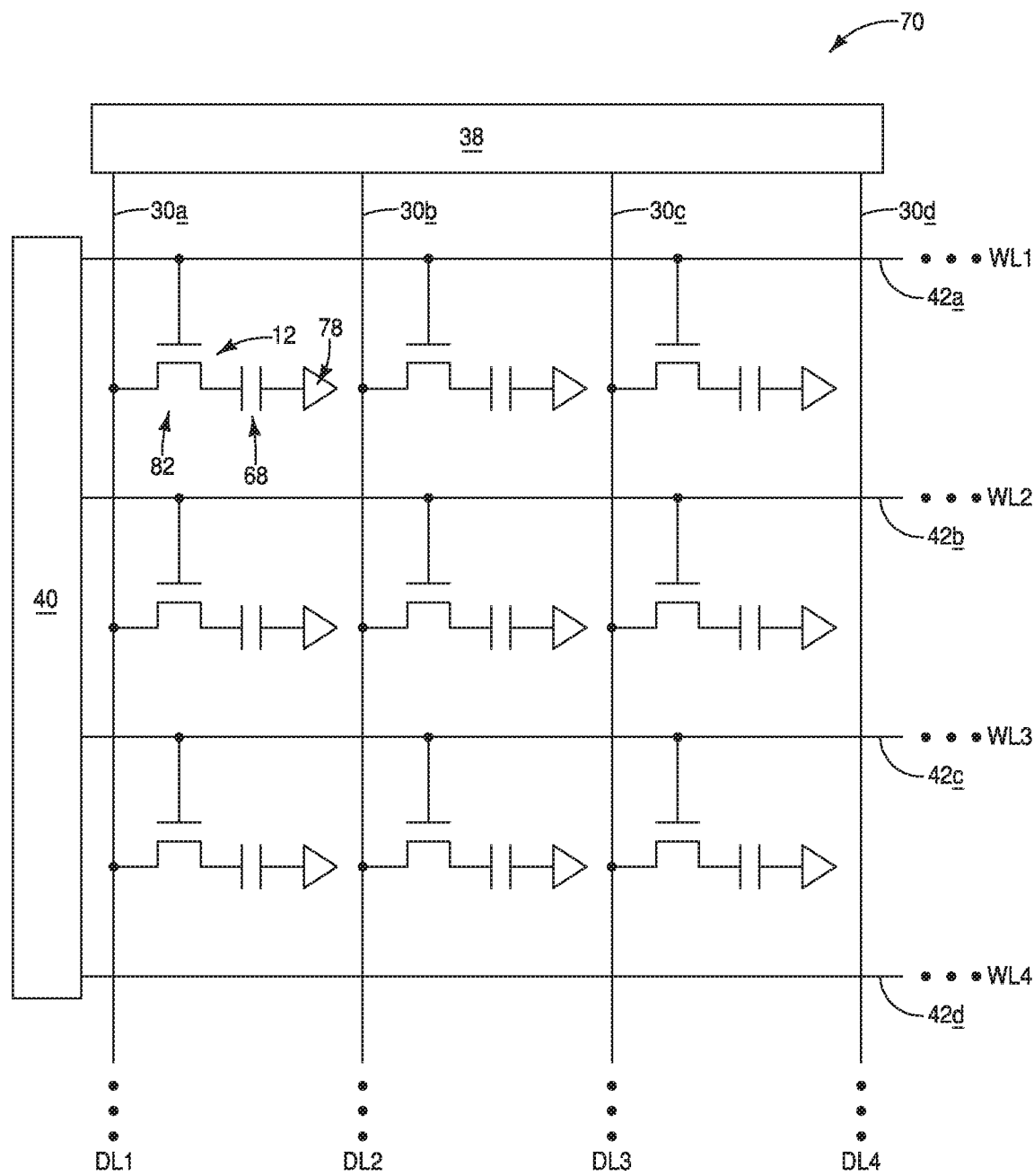
FIG. 9 is a diagrammatic schematic view of a region of an example memory array.

FIG. 8 shows the assembly 10 in a configuration analogous to that of FIG. 7, except that the etch-stop material 56 is shown to comprise the two materials 56a and 56b which were described above with reference to FIG. 4B.

The memory arrays 70 of FIGS. 7 and 8 may have any suitable configurations. FIG. 9 shows an example configuration for a DRAM array. Such configuration has digit lines 30a-d (DL1-DL4) extending along columns of the array and being coupled with the sensing circuitry 38, and has wordlines 42a-d (WL1-WL4) extending along rows of the array and being coupled with the driver circuitry 40. The configuration of FIG. 9 also has the memory cells 82 (only one of which is labeled), with each of the memory cells being uniquely addressed by one of the digit lines in combination with one of the wordlines.

The illustrated memory array 70 of FIG. 9 is a DRAM array. In other embodiments the memory array 70 may be a FeRAM array.

An advantage of the processing described herein may be that such can improve alignment to the interconnects 48 as compared to arrangements lacking the etch-stop material 56. The improved alignment may lead to higher yield of functional memory devices (and associated lower costs), improved reliability of memory cells associated with the memory devices, etc. In some applications, the utilization of the etch-stop material 56 may improve cross-wafer uniformity as compared to conventional fabrication processes lacking such etch-stop material. In some embodiments, the uniformity may be such that there is less than or equal to about 5 nm of variation in height of the structures corresponding to bottom electrodes 72/interconnects 48 across a wafer subsequent to fabrication of the capacitors 68; where the term "about 5 nm" means 5 nm to within reasonable tolerances of fabrication and measurement.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having active regions which include semiconductor material. Capacitor-contact-regions are within the active regions. Metal-containing interconnects are coupled with the capacitor-contact-regions. A first insulative material is laterally between the capacitor-contact-regions and is laterally between the metal-containing interconnects. A second insulative material is over the first insulative material and is of a different composition than the first insulative material. A third insulative material is over the second insulative material and is of a different composition than the second insulative material. First capacitor electrodes extend through the second and third insulative materials and are coupled with the metal-containing interconnects. Fourth insulative material is adjacent the first capacitor electrodes. Capacitor plate electrodes are adjacent the fourth insulative material and are spaced from the first capacitor electrodes by the fourth insulative material.

Some embodiments include a memory array comprising vertically-extending pillars of semiconductor material. The vertically-extending pillars comprise lower source/drain regions, upper source/drain regions, and channel regions between the lower and upper source/drain regions. First conductive structures extend along columns of the memory array and have segments adjacent the lower source/drain regions and electrically coupled with the lower source/drain regions. Second conductive structures extend along rows of the memory array and have segments adjacent the channel regions. Metal-containing interconnects are over the upper source/drain regions and are electrically coupled with the upper source/drain regions. A first insulative material is laterally between the vertically-extending pillars and is laterally between the metal-containing interconnects. A second insulative material is over the first insulative material and is of a different composition than the first insulative material. A third insulative material is over the second insulative material and is of a different composition than the second insulative material. First capacitor electrodes extend through the second and third insulative materials and are coupled with the metal-containing interconnects. Fourth insulative material is adjacent the first capacitor electrodes. Capacitor plate electrodes are adjacent the fourth insulative material and are spaced from the first capacitor electrodes by the fourth insulative material.

Some embodiments include a method of forming an integrated assembly. A construction is formed to include laterally-spaced access transistors. Each of the access transistors has a vertically-extending active region comprising semiconductor material. The vertically-extending active regions comprise lower source/drain regions, upper source/drain regions, and channel regions between the lower and upper source/drain regions. The construction includes first conductive structures which have segments adjacent the lower source/drain regions, and includes second conductive structures which have segments adjacent the channel regions. The construction includes insulative regions between the laterally-spaced access transistors. Interconnects are formed to be coupled with the upper source/drain regions. A first material is formed which extends across the interconnects and across the insulative regions. A second material is formed over the first material. Openings are formed with a first etch. The first etch forms the openings to extend through the second material to expose the first material. The openings are extended with a second etch different from the first etch. The second etch extends the openings through the first material to expose the interconnects. First electrode material is formed within the openings to line the openings. Dielectric material and second electrode material are formed within the lined openings. The first electrode material, dielectric material and second electrode material together form capacitors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   a switching device comprising a diode having an electrode comprising at least two separate and discrete material structures having a defined boundary between the two discrete material structures, wherein an upper surface of the electrode comprises a substantially round-nose-bullet-shape along a cross-section; and
   a capacitor comprising a bottom electrode, cell dielectric material and a top electrode at least partially formed in a container opening, wherein the bottom electrode of the capacitor is in direct contact with the substantially round-nose-bullet-shape of the upper surface of the electrode of the switching device; and
   wherein the bottom electrode and the cell dielectric material of the capacitor has to accommodate the contact with the round-nose-bullet-shape of the upper surface of the electrode with curved portions, the curved portions of the bottom electrode and the cell dielectric material being the only curved portions of the capacitor.

2. The memory cell of claim 1, wherein there is no contact plug or landing pad between the electrode of the switching device and the bottom electrode of the capacitor.

3. The memory cell of claim 1, wherein the electrode comprises at least two discrete material structures.

4. The memory cell of claim 1, wherein the electrode comprises at least three discrete material structures.

5. The memory cell of claim 1, further comprising:
   a first insulative material laterally adjacent the electrode; and
   a second insulative material over the first insulative material and elevationally above the electrode.

6. The memory cell of claim 1, wherein the electrode of the diode comprises conductively-doped semiconductor material.

7. The memory cell of claim 1 further comprising an etch-stop layer contacting the capacitor, the etch-stop layer comprises a metal oxide.

8. The memory cell of claim 1 further comprising an etch-stop layer contacting the capacitor, the etch-stop layer comprises at least one of hafnium oxide and zirconium oxide.

9. The memory cell of claim 1 further comprising an etch-stop layer contacting the capacitor, the etch-stop layer comprises a monolayer.

* * * * *